(12) United States Patent
Backlund et al.

(10) Patent No.: US 9,450,187 B2
(45) Date of Patent: Sep. 20, 2016

(54) PROCESS OF SURFACE MODIFICATION OF DIELECTRIC STRUCTURES IN ORGANIC ELECTRONIC DEVICES TO INCREASE SURFACE ENERGY

(71) Applicant: MERCK PATENT GmbH, Darmstadt (DE)

(72) Inventors: Tomas Backlund, Southampton (GB); Philip Edward May, Sidcup (GB)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 14/426,037

(22) PCT Filed: Aug. 6, 2013

(86) PCT No.: PCT/EP2013/002342
§ 371 (c)(1),
(2) Date: Mar. 4, 2015

(87) PCT Pub. No.: WO2014/037076
PCT Pub. Date: Mar. 13, 2014

(65) Prior Publication Data
US 2015/0228903 A1 Aug. 13, 2015

(30) Foreign Application Priority Data
Sep. 4, 2012 (EP) .................................... 12006240

(51) Int. Cl.
*H01L 51/00* (2006.01)
*H01L 51/05* (2006.01)
*H01L 51/10* (2006.01)

(52) U.S. Cl.
CPC ....... *H01L 51/0043* (2013.01); *H01L 51/0015* (2013.01); *H01L 51/0529* (2013.01); *H01L 51/0541* (2013.01); H01L 51/052 (2013.01); H01L 51/107 (2013.01); Y02E 10/549 (2013.01)

(58) Field of Classification Search
CPC .......... H01L 51/0043; H01L 51/0541; H01L 51/0015; H01L 51/0529
See application file for complete search history.

(56) References Cited

U.S. PATENT DOCUMENTS

| 8,624,330 B2 | 1/2014 | Daniel et al. |
| 2008/0224127 A1* | 9/2008 | Marks ................. H01L 51/0533 257/40 |
| 2010/0127268 A1* | 5/2010 | Daniel ................. H01L 51/0529 257/66 |
| 2012/0056183 A1 | 3/2012 | Mueller et al. |
| 2014/0117448 A1 | 5/2014 | Daniel et al. |

FOREIGN PATENT DOCUMENTS

| WO | 2012028279 A1 | 3/2012 | |
| WO | WO 2012028279 A1 * | 3/2012 | ............ C08F 232/00 |

OTHER PUBLICATIONS

International Search Report for PCT/EP2013/002342 dated Feb. 4, 2014.
Taylor, W., "Technical Synopsis of Plasma Surface Treatments," University of Florida, Gainesville, FL, Dec. 2009, Advisor: Dr. Bruce Welt.

* cited by examiner

*Primary Examiner* — John P Dulka
(74) *Attorney, Agent, or Firm* — Millen, White, Zelano and Branigan, P.C.

(57) ABSTRACT

The invention relates to a process of modifying the surface energy of dielectric structures, like for example dielectric layers or bank structures, in organic electronic (OE) devices, more specifically in organic field effect transistors (OFETs).

21 Claims, 5 Drawing Sheets

PROCESS OF SURFACE MODIFICATION OF DIELECTRIC STRUCTURES IN ORGANIC ELECTRONIC DEVICES TO INCREASE SURFACE ENERGY

TECHNICAL FIELD

The invention relates to a process of modifying the surface energy of dielectric structures, like for example dielectric layers or bank structures, in organic electronic (OE) devices, more specifically in organic field effect transistors (OFETs).

BACKGROUND

In recent years there has been growing interest in OE devices, for example OFETs for use in display devices and logic capable circuits, or organic photovoltaic (OPV) devices.

A typical OFET device includes a substrate, source and drain electrodes that are spaced apart to define a channel region therebetween, a semiconducting layer comprising an organic semiconductor (OSC) material provided at least in the channel region, a gate dielectric layer, and a gate electrode. In addition, the OFET may comprise one or more bank structures, which may for example be patterned such that they define a well extending over the channel region, wherein the OSC layer material can be deposited.

The gate dielectric layer and the OSC layer usually comprise organic materials that are deposited from solution. Therefore the solvents used for coating the gate dielectric layer and the OSC layer, respectively, should be selected from orthogonal systems, to avoid that the layer that is coated first is dissolved by the solvent of the layer that is coated second.

As a consequence, top gate OFET devices typically include a gate dielectric layer comprising a fluorinated material, usually an organic fluoropolymer, because the previously deposited OSC layer is typically selected from materials that are soluble in a broad range of solvents, so that the only solvents for depositing the gate dielectric layer, which are orthogonal to the OSC layer, are fluorinated solvents.

However, the drawback of such gate dielectric layers is the low surface energy of the fluorinated material. The contact angle of water for such layers can be >110°, and it is very difficult to coat or print further device layers onto the surface of such fluorinated gate dielectric layer. In addition, the adhesion of further device layers, like the gate electrode, deposited onto such fluorinated gate dielectric layers is usually very low.

To overcome these drawbacks and enable printing or coating onto a fluorinated dielectric film, plasma treatment or chemical treatment have been proposed for increasing the surface energy by creating new functional groups on the surface. Alternatively, additionally coatings have been proposed to enable printing on top on the dielectric film. However, the adhesion of such films is often poor, and is not compatible with process integration.

Other drawbacks of conventional OE devices, like for example OFETs or OLEDs, are related to de-wetting problems at the bank structures. Thus, if fluorinated bank structure materials are used, other materials, like for example the OSC, that are deposited in the well defined by the bank structures, can de-wet from the walls of the bank structures. Therefore a higher surface energy in these parts of the bank structures is desired. On the other hand, the top surface of the bank structures should have a lower surface energy to avoid wetting with such other materials during their deposition. Therefore, it is desired that bank structures have different surface properties in order to create wetting contrast in a way that other materials de-wet from the bank structures into the defined well therebetween.

Therefore, there is still a need for suitable methods to modify the surface energy of fluorinated insulating structures, like gate dielectric layers, in OE devices like OFETs, especially in top gate OFETs, which fulfil the requirements and overcome the drawbacks as discussed above. In particular, there is a need for a method to increase the surface energy of insulating structures in OE devices, in particular in bank structures or gate dielectric layers, and to increase the adhesion of gate dielectric layers to further layers deposited thereon.

One aim of the present invention is to provide such improved methods. Another aim is to provide improved OE devices prepared by such methods. Further aims are immediately evident to the person skilled in the art from the following description.

The inventors have found these aims can be achieved by providing a method of modifying the surface energy of fluorinated insulating structures in accordance with the present invention and as claimed hereinafter.

SUMMARY

The invention relates to a process of surface treatment of a dielectric structure in an organic electronic (OE) device, comprising the step of exposing the surface of the dielectric structure, or specific parts of said surface, to a solvent blend comprising
a first solvent selected from the group consisting of aliphatic or aromatic alcohols, and
a second solvent selected from the group consisting of aliphatic esters and aliphatic ketones.

The first solvent is preferably selected from the group consisting of methanol, cyclohexanol, isopropanol, benzyl alcohol.

The second solvent is preferably selected from the group consisting of methyl acetate, ethyl acetate, methyl n-amyl ketone.

The invention further relates to a method of surface treatment as described above and below, wherein the surface energy of said dielectric structure after exposure to said solvent or solvent blend is higher than the surface energy of said dielectric structure before exposure to said solvent or solvent blend.

The dielectric structure is preferably a gate dielectric layer, passivation layer, planarization layer, insulating structure or bank structure, or a part of one of the aforementioned layers or structures.

The dielectric structure preferably comprises a crosslinked organic polymer. The organic polymer is preferably a crosslinked and fluorinated polymer. Further preferably the organic polymer is a crosslinked polycycloolefinic polymer that is preferably fluorinated.

The invention further relates to an OE device comprising a dielectric structure that was subjected to a method of surface treatment as described above and below.

The OE device is preferably example an Organic Field Effect Transistor (OFET), including Organic Thin Film Transistors (OTFT), an Organic Light Emitting Diode (OLED), an Organic Photovoltaic (OPV) device or an Organic Photodetector (OPD), especially a top gate OFET or bottom gate OFET, very preferably a top gate OFET.

The invention further relates to a product or an assembly comprising an organic electronic device as described above and below. Such product or assembly is preferably an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an organic memory device, a pressure sensor, an optical sensor, a chemical sensor, a biosensor or a biochip.

BRIEF DESCRIPTION OF THE DRAWINGS

Embodiments of the invention are described below with reference to the following drawings.

DETAILED DESCRIPTION

Figure 1:
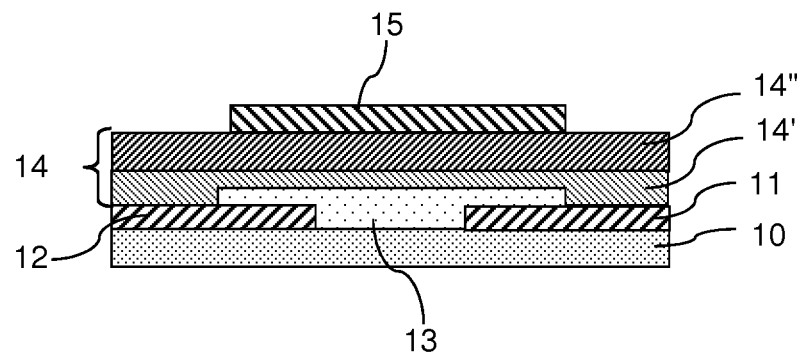
FIG. 1 is a schematic representation of a top gate OFET device in accordance with the present invention.

As used herein, the term Organic Field Effect Transistors (OFET) will be understood to be inclusive of the subclass of such devices known as Organic Thin Film Transistors (OTFTs).

In addition, it will be understood that the terms "dielectric" and "insulating" are used interchangeably herein. Thus reference to an insulating material or layer is inclusive of a dielectric material or layer. Further, as used herein, the term "organic electronic device" will be understood to be inclusive of the term "organic semiconductor device" and the several specific implementations of such devices such as the OFETs as defined above.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the terms "insulating structure(s)" and "bank structure(s)" will be understood to mean a patterned structure, for example a patterned layer, that is provided on an underlying substrate and defines a specific structure, for example a well, on said substrate that can be filled by a functional material like a semiconductor or a dielectric. The patterned structure comprises a structure defining material that is selected such that a surface energy contrast is created between said patterned structure and said substrate. Usually the substrate has a higher surface energy while the patterned structure has a lower surface energy. The substrate is for example a functional layer of an electronic device, like an electrode, a semiconducting layer or a dielectric layer. The insulating or bank structure is used to define more easily the active area of a solution-processed thin film of, for example, the semiconductor in an electronic device, by using the tendency of the liquid solution to move and stick to the area having higher surface energy, i.e., the substrate. By confining the liquid in a given area, a thin film can be formed as needed in the specific device application. This provides certain benefits, for example in OFETs the confined area of organic semiconductor improves the off-state current. It will be understood that the terms "bank structure(s)" and "insulating structure(s)" are used interchangeably herein. Thus reference to a bank structure is inclusive of an insulating structure.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the term "polymer composition" means at least one polymer and one or more other materials added to the at least one polymer to provide, or to modify, specific properties of the polymer composition and or the at least one polymer therein. It will be understood that a polymer composition is a vehicle for carrying the polymer to a substrate to enable the forming of layers or structures thereon. Exemplary materials include, but are not limited to, solvents, antioxidants, photoinitiators, photosensitizers, crosslinking moieties or agents, reactive diluents, acid scavengers, leveling agents and adhesion promoters. Further, it will be understood that a polymer composition may, in addition to the aforementioned exemplary materials, also encompass a blend of two or more polymers.

As defined herein, the terms "polycycloolefin", "polycyclic olefin", and "norbornene-type" are used interchangeably and refer to addition polymerizable monomers, or the resulting repeating unit, encompassing at least one norbornene moiety such as shown by either Structure A1 or A2, below. The simplest norbornene-type or polycyclic olefin monomer bicyclo[2.2.1]hept-2-ene (A1) is commonly referred to as norbornene.

(A1)

(A2)

However, the term "norbornene-type monomer" or "norbornene-type repeating unit", as used herein, is understood to not only mean norbornene itself but also to refer to any substituted norbornene, or substituted and unsubstituted higher cyclic derivatives thereof, for example of Structures B1 and B2, shown below, wherein m is an integer greater than zero.

(B1)

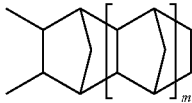
(B2)

By the substitution of a norbornene-type monomer with a pendant group, the properties of a polymer formed therefrom can be tailored to fulfill the needs of individual applications. The procedures and methods that have been developed to polymerize functionalized norbornene-type monomers exhibit an outstanding flexibility and tolerance to various moieties and groups of the monomers. In addition to polymerization of monomers with a specific pendant group, monomers having a variety of distinct functionalities can be randomly polymerized to form a final material where the types and ratios of monomers used dictate the overall bulk properties of the resulting polymer.

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, or I). The term perhalocarbyl refers to a hydrocarbyl group where each hydrogen has been replaced by a halogen. Non-limiting examples of hydrocarbyls, include, but are not limited to a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. Representative alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include but are not limited to vinyl, propenyl, butenyl and hexenyl. Representative alkynyl groups include but are not limited to ethynyl, 1-propynyl, 2-propynyl, 1 butynyl, and 2-butynyl. Representative cycloalkyl groups include but are not limited to cyclopentyl, cyclohexyl, and cyclooctyl substituents. Representative aryl groups include but are not limited to phenyl, biphenyl, naphthyl, and anthracenyl. Representative aralkyl groups include but are not limited to benzyl, phenethyl and phenbutyl.

The term "halohydrocarbyl" as used herein is inclusive of the hydrocarbyl moieties mentioned above but where there is a degree of halogenation that can range from at least one hydrogen atom being replaced by a halogen atom (e.g., a fluoromethyl group) to where all hydrogen atoms on the hydrocarbyl group have been replaced by a halogen atom (e.g., trifluoromethyl or perfluoromethyl), also referred to as perhalogenation. For example, halogenated alkyl groups that can be useful in embodiments of the present invention can be partially or fully halogenated, alkyl groups of the formula $C_aX_{2a+1}$ wherein X is independently a halogen or a hydrogen and a is selected from an integer of 1 to 25. In some embodiments each X is independently selected from hydrogen, chlorine, fluorine bromine and/or iodine. In other embodiments each X is independently either hydrogen or fluorine. Thus, representative halohydrocarbyls and perhalocarbyls are exemplified by the aforementioned exemplary hydrocarbyls where an appropriate number of hydrogen atoms are each replaced with a halogen atom.

In addition, the definition of the terms "hydrocarbyl", "halohydrocarbyl", and "perhalohydrocarbyl", are inclusive of moieties where one or more of the carbons atoms is replaced by a heteroatom selected independently from O, N, P, or Si. Such heteroatom containing moieties can be referred to as, for example, either "heteroatom-hydrocarbyls" or "heterohydrocarbyls", including, among others, ethers, epoxies, glycidyl ethers, alcohols, carboxylic acids, esters, maleimides, amines, imines, amides, phenols, amidophenols, silanes, siloxanes, phosphines, phosphine oxides, phosphinites, phosphonites, phosphites, phosphonates, phosphinates, and phosphates.

Further exemplary hydrocarbyls, halohydrocarbyls, and perhalocarbyls, inclusive of heteroatoms, include, but are not limited to, $-(CH_2)_n-Ar-(CH_2)_n-C(CF_3)_2-OH$, $-(CH_2)_n-Ar-(CH_2)_n-OCH_2C(CF_3)_2-OH$, $-(CH_2)_n-C(CF_3)_2-OH$, $-((CH_2)_i-O-)_k-(CH_2)-C(CF_3)_2-OH$, $-(CH_2)_n-C(CF_3)(CH_3)-OH$, $-(CH_2)_n-C(O)NHR^*$, $-(CH_2)_n-C(O)Cl$, $-(CH_2)_n-C(O)OR^*$, $-(CH_2)_n-OR^*$, $-(CH_2)_n-OC(O)R^*$ and $-(CH_2)_n-C(O)R^*$, where n independently represents an integer from 0 to 12, i is 2, 3 or 4, k is 1, 2 or 3, Ar is aryl, for example phenyl, and $R^*$ independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl.

Exemplary perfluorinated alkyl groups include, but are not limited to, trifluoromethyl, $-C_2F_5$, $-C_3F_7$, $-C_4F_9$, $C_6F_{13}-$, $-C_7F_{15}$, and $-C_{11}F_{23}$. Exemplary fluorinated or perfluorinated aryl and aralkyl groups include, but are not limited to, groups having the formula $-(CH_2)_x-C_6F_yH_{5-y}$, and $-(CH_2)_x-C_6F_yH_{4-y}$-$pC_zF_qH_{2z+1-q}$, where x, y, q and z are independently selected integers from 0 to 5, 0 to 5, 0 to 9 and 1 to 4, respectively. Specifically, such exemplary fluorinated or perfluorinated aryl groups include, but are not limited to, pentafluorophenyl, pentafluorobenzyl, 4-trifluoromethylbenzyl, pentafluorophenethyl, pentafluorophenpropyl, and pentafluorophenbutyl.

The present invention specifically relates to OE devices and methods of manufacturing the same using solution processing methods, and novel methods of treating the surfaces of dielectric structures in such OE devices, like for example gate dielectric layers or bank structures. It was found that, when the surface of such dielectric structures is exposed to a specific solvent or a solvent blend, their surface energy can be increased.

In a first preferred embodiment, the dielectric structure is a gate dielectric layer, or part of a gate dielectric layer, in an OE device, preferably in an OFET device, very preferably in a top gate OFET device, said device further comprising an OSC layer.

Preferably, in said first preferred embodiment, the gate dielectric layer comprises a crosslinked polymer, which is preferably fluorinated. Further preferably the gate dielectric layer comprises a crosslinked polymer which is a polycycloolefinic polymer and preferably comprises one or more pendant fluorinated groups.

Further preferably, in said first preferred embodiment, the gate dielectric layer comprises a first dielectric layer that contacts the OSC layer and a second dielectric layer that contacts the gate electrode, wherein at least one of the first and second dielectric layer, preferably at least the second dielectric layer, very preferably both the first and the second dielectric layer, comprise a fluorinated polymer.

The first dielectric layer preferably comprises an organic material having a permittivity ∈ of 3.0 or less ("low k dielectric"). In a preferred embodiment ∈ is in the range of from 1.3 to 3.0, very preferably from 1.7 to 3.0. In another preferred embodiments ∈ is in the range of from 2.0 to 3.0.

In still another preferred ∈ is in the range from 2.5 to 3.0 In still another preferred ∈ is in the range from 2.0 to 2.6.

Further preferably the first dielectric layer comprises a low k dielectric material which is an organic fluoropolymer, preferably a prefluorinated polymer. Suitable and preferred low k fluoropolymers include, for example, highly soluble perfluoropolymers like those from the commercially available CYTOP™ series (Asahi Glass), Teflon AF® series (DuPont) or Hyflon AD® series (from Solvay). CYTOP polymers are described in "Modern Fluoroplastics", edited by John Scheris, John Wiley&Sons Ltd., 1997, Chapter: "Perfluoropolymers Obtained by Cyclopolymerisation" by N. Sugiyama, pages 541 ff. Teflon AF is described in "Modern Fluoroplastics", edited by John Scheris, John Wiley&Sons Ltd., 1997, Chapter: "Teflon AF amorphous fluoropolymers" by P. R. Resnick, pages 397 ff. Hyflon AD is described in "High Performance Perfluoropolymer Films and Membranes" V. Arcella et. al., Ann. N.Y. Acad. Sci. 984, pages 226-244 (2003). Preferably the fluorinated polymer of the first dielectric layer is not a polycycloolefinic polymer.

The second dielectric layer preferably comprises a crosslinked polycycloolefinic polymer comprising one or more pendant fluorinated groups.

In a second preferred embodiment, the dielectric structure is a bank structure, or another insulating structure, in an OE device, preferably in an OFET, OPV, OPD or OLED device.

Preferably the insulating or bank structure comprises a crosslinked polymer, which is preferably fluorinated. Further preferably the insulating or bank structure comprises a crosslinked polymer which is a polycycloolefinic polymer and preferably comprises one or more pendant fluorinated groups.

Polycycloolefinic polymers combine the processing from non-fluorinated environmentally benign solvents with the possibility of applying UV curing processes, and can also be coated by standard methods like ink-jet printing or flexo printing. Besides, the processing and curing of polycycloolefinic polymers does not require photoactive additives like photocatalysts, so that impurities resulting from the photoreaction of such additives can be avoided in the cured structures.

The polycycloolefinic polymers are preferably norbornene-type polymers.

In a preferred embodiment the norbornene-type polymer comprises one or more distinct types of repeating units of Formula I

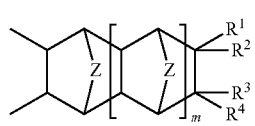

(I)

wherein Z is selected from —$CH_2$—, —$CH_2$—$CH_2$— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group, wherein at least one of $R^1$, $R^2$, $R^3$ and $R^4$ is a fluorinated group.

The repeating units of Formula I are formed from the corresponding norbornene-type monomers of Formula Ia where Z, m and $R^{1-4}$ are as defined above:

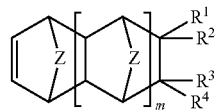

(Ia)

In the repeating units and monomers of Formula I and Ia, in a preferred embodiment Z is —$CH_2$— and m is 0, 1 or 2, in another preferred embodiment, Z is —$CH_2$— and m is 0 or 1, and in still another preferred embodiment, Z is —$CH_2$— and m is 0.

The dielectric structure can comprise a single norbornene-type polymer or a blend of two or more different norbornene-type polymers. Where the dielectric structure comprises a single norbornene-type polymer, such polymer can be a homopolymer, that is to say a polymer encompassing only one type of repeating unit, or a copolymer, that is to say a polymer encompassing two or more distinct types of repeating units. Where the dielectric structure comprises a blend of different polymers, "different" is understood to mean that each of the blended polymers encompasses at least one type of repeating unit, or combination of repeating units, that is distinct from any of the other blended polymers.

In another preferred embodiment of the invention the dielectric structure comprises a blend of two or more different norbornene-type polymers, wherein each polymer comprises one or more distinct types of repeating units of formula I

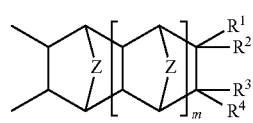

(I)

wherein Z is selected from —$CH_2$—, —$CH_2$—$CH_2$— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group, and wherein on at least one of the polymers at least one of $R^1$, $R^2$, $R^3$ and $R^4$ is a fluorinated group.

The polymer and polymer composition embodiments of the present invention can advantageously be tailored to provide a distinct set of properties for each of many specific applications. That is to say that different combinations of norbornene-type monomers with several different types of pendant groups can be polymerized to provide norbornene-type polymers having properties that provide for obtaining control over properties such as flexibility, adhesion, dielectric constant, and solubility in organic solvents, among others. For example, varying the length of an alkyl pendant group can allow control of the polymer's modulus and glass transition temperature (Tg). Also, pendant groups selected from maleimide, cinnamate, coumarin, anhydride, alcohol, ester, and epoxy functional groups can be used to promote crosslinking and to modify solubility characteristics. Polar functional groups, epoxy and triethoxysilyl groups can be used to provide adhesion to metals, silicon, and oxides in adjacent device layers. Fluorinated groups, for example, can be used to effectively modify surface energy, dielectric constant and influence the orthogonality of the solution with respect to other materials.

Preferably the norbornene-type polymer incorporates two or more distinct types of repeating units, preferably selected of Formula I, wherein at least one of said repeating units comprises a pendant fluorinated group and at least one other of said repeating units comprising a pendant crosslinkable group.

Preferably said norbornene-type polymer comprises one or more first, distinct types of repeating units of Formula I wherein one or more of $R^{1-4}$ are different from H, very preferably wherein only one of $R^{1-4}$ is different from H, and denote a fluorinated or perfluorinated aryl or aralkyl group. Further preferably said norbornene type polymer comprises one or more second, distinct types of repeating units of Formula I wherein one or more of $R^{1-4}$ are different from H, very preferably wherein only one of $R^{1-4}$ is different from H, and denote a crosslinkable group.

The fluorinated groups in the norbornene-type polymer are preferably selected from fluorinated or perfluorinated aryl or aralkyl groups including, but not limited to those of the formula $-(CH_2)_x-C_6F_yH_{5-y}$, and $-(CH_2)_x-C_6F_yH_{4-y}\text{-}pC_zF_qH_{2z+1-q}$, where x, y, q, and z are independently selected integers from 0 to 5, 0 to 5, 0 to 9, and 1 to 4, respectively, and "p" means "para". Specifically such formulae include, but are not limited to, trifluoromethyl, $-C_2F_5$, $-C_3F_7$, $-C_4F_9$, $C_6F_{13}$, $-C_7F_{15}$, $-C_{11}F_{23}$, pentafluorophenyl, pentafluorobenzyl, 4-trifluoromethylbenzyl, pentafluorophenylethyl, pentafluorophenpropyl, and pentafluorophenbutyl.

Further preferably the norbornene-type polymer comprises one or more repeating units of Formula I that are formed by one or more norbornene-type monomers selected from the group consisting of the following formulae:

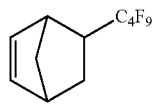

NBC$_4$F$_9$

1

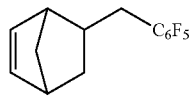

NBCH$_2$C$_6$F$_5$

2

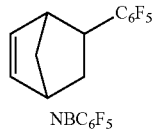

NBC$_6$F$_5$

3

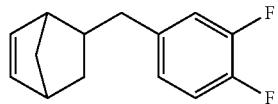

NBCH$_2$C$_6$H$_3$F$_2$

4

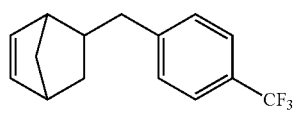

NBCH$_2$C$_6$H$_4$CF$_3$

5

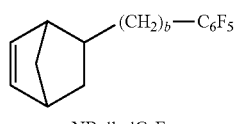

NBalkylC$_6$F$_5$

6

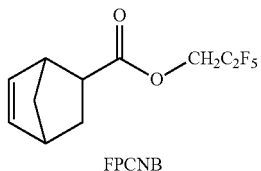

FPCNB

7

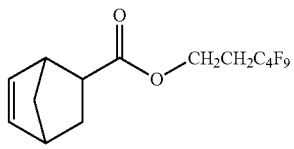

FHCNB

8

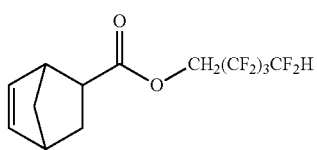

FOCHNB

9

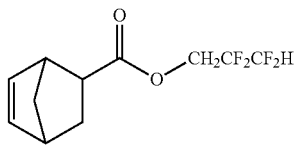

FPCHNB

10

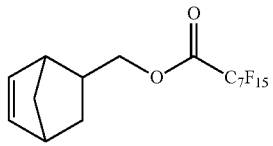

C$_8$PFAcNB

11

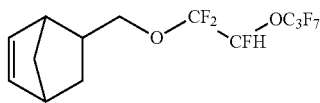

PPVENB

12 where "C$_6$F$_5$" means pentafluorophenyl, in sub-formula 11 "PFAc" means $-OC(O)-C_7F_{15}$, and for each of the above subformulae having a methylene bridging group (a CH$_2$ covalently bonded to both the norbornene ring and a functional group) it will be understood that the methylene bridging group can be replaced by a covalent bond or a group $-(CH_2)_b-$ as in formula 6, and b is an integer from 1 to 6.

Further preferably the norbornene-type polymer comprises one or more repeating units of Formula I where one of $R^{1-4}$, for example $R^1$, is a fluorinated or perfluorinated alkyl, aryl or aralkyl group as described above and the others of $R^{1-4}$ are H, and wherein $R^1$ is selected from one of the above subformulae 1-12 (NBC$_4$F$_9$, NBCH$_2$C$_6$F$_5$, NBC$_6$F$_5$, NBCH$_2$C$_6$H$_3$F$_2$, NBCH$_2$C$_6$H$_4$CF$_3$, NBalkylC$_6$F$_5$, FPCNB, FHCNB, FOCHNB, FPCHNB, C$_8$PFAcNB, PPVENB), and and more preferably from subformulae 2, 3, 14 5, 6 or 12 (NBCH$_2$C$_6$F$_5$, NBC$_6$F$_5$, NBCH$_2$C$_6$H$_3$F$_2$, NBCH$_2$C$_6$H$_4$CF$_3$, NBalkylC$_6$F$_5$ or PPVENB).

Preferred pendant crosslinkable groups are those that have some degree of latency. By "latency", it is meant that such groups do not crosslink at ambient conditions or during the initial forming of the polymers, but rather crosslink when such reactions are specifically initiated, for example by actinic radiation or heat. Such latent crosslinkable groups are incorporated into the polymer backbone by, for example, providing one or more norbornene-type monomers encompassing such a pendant crosslinkable group, for example a substituted or unsubstituted maleimide or maleimide containing pendant group, to the polymerization reaction mixture and causing the polymerization thereof. Preferred crosslinkable groups include a group comprising a substituted or unsubstituted maleimide portion, an epoxide portion, a vinyl portion, an acetylene portion, an indenyl portion, a cinnamate portion or a coumarin portion, and more specifically a group selected from a 3-monoalkyl- or 3,4-dialkylmaleimide, epoxy, vinyl, acetylene, cinnamate, indenyl or coumarin group.

Further preferred crosslinkable groups encompass a linking portion L and a functional portion F. Preferably L denotes or comprises a group selected from $C_1$-$C_{12}$ alkyls, aralkyls, aryls or hetero atom analogs. Further preferably F denotes or comprises one or more of a maleimide, a 3-monoalkyl- or 3,4-dialkylmaleimide, epoxy, vinyl, acetylenic, cinnamate, indenyl or coumarin moiety, which is capable of a crosslinking or 2+2 crosslinking reaction.

As used herein, the phrase "photoreactive and/or crosslinkable", when used to describe certain pendant groups, will be understood to mean a group that is reactive to actinic radiation and as a result of that reactivity enters into a crosslinking reaction, or a group that is not reactive to actinic radiation but can, in the presence of a crosslinking activator, enter into a crosslinking reaction.

Further preferably the norbornene-type polymer comprises one or more repeating units of Formula I that are formed during polymerization from norbornene-type monomers selected from the groups consisting of the following formulae:

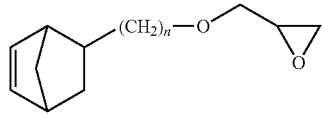

P1

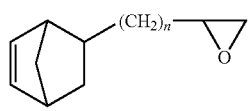

P2

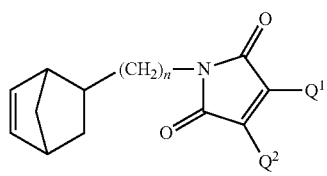

P3

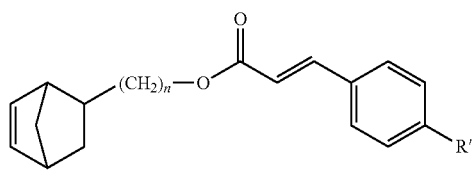

P4

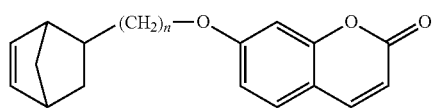

P5

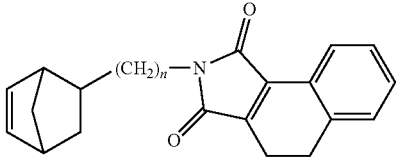

P6

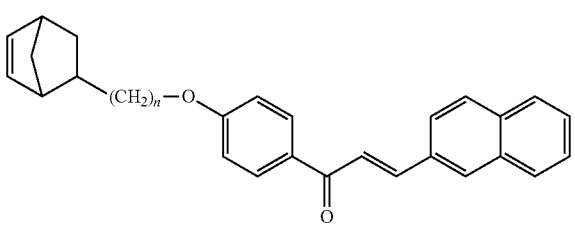

P7 where n is an integer from 1 to 8, $Q^1$ and $Q^2$ are each independently from one another —H or —CH$_3$, and R' is —H or —OCH$_3$.

Further preferably the norbornene-type polymer comprises one or more repeating units of Formula I that are formed during polymerization from norbornene-type monomers selected from the group consisting of the following formulae:

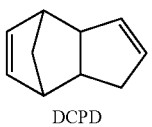

DCPD

13

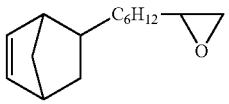

EONB

14

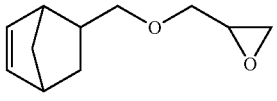

MGENB

15

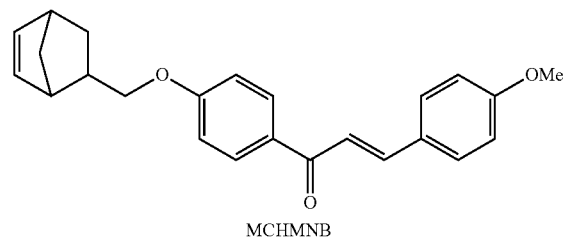

MCHMNB

16

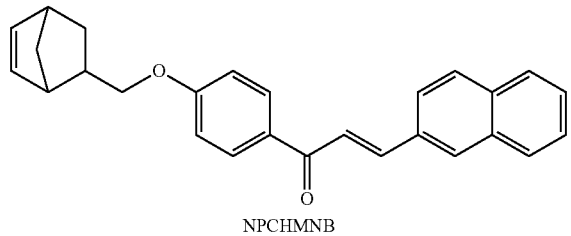

NPCHMNB

17

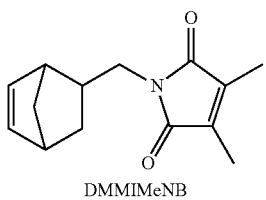
DMMIMeNB
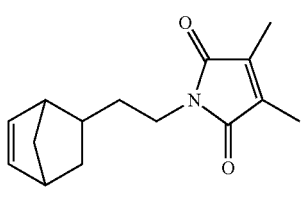
DMMIEtNB
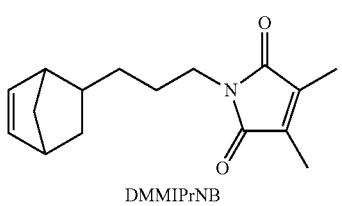
DMMIPrNB
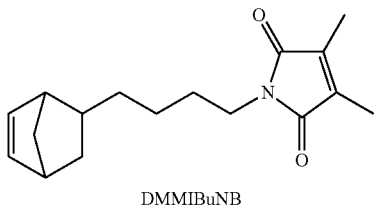
DMMIBuNB
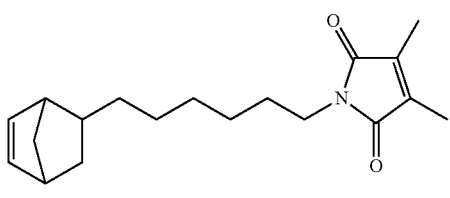
DMMIHxNB
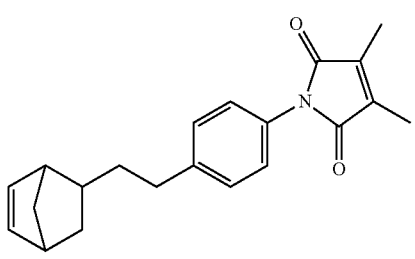
EtPhDMMINB
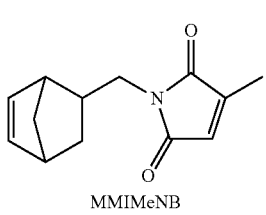
MMIMeNB
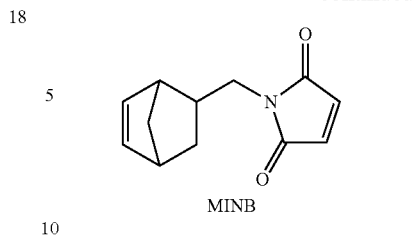
MINB
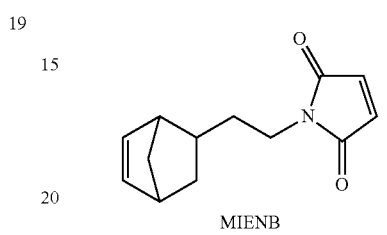
MIENB
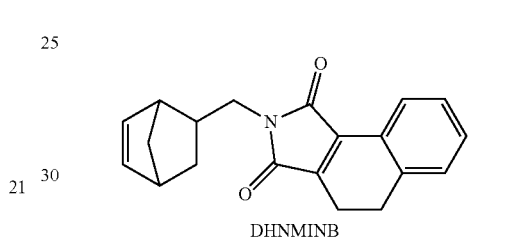
DHNMINB
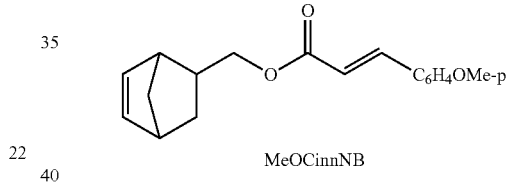
MeOCinnNB
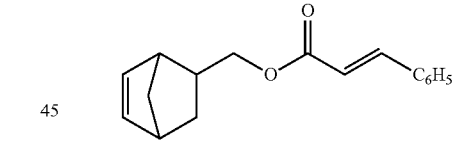
CinnNB
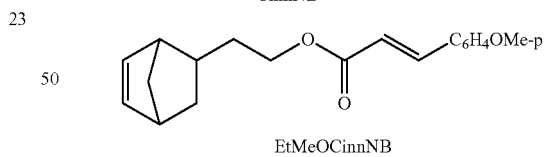
EtMeOCinnNB
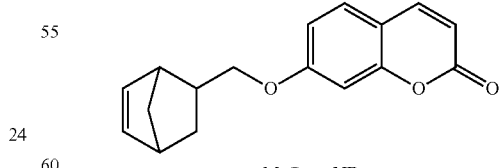
MeCoumNB
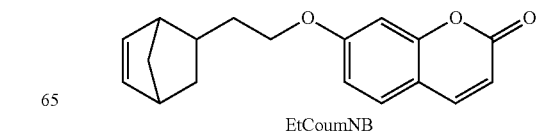
EtCoumNB

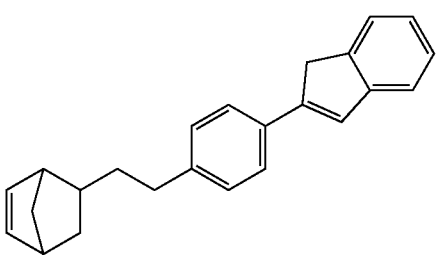

EtPhIndNB

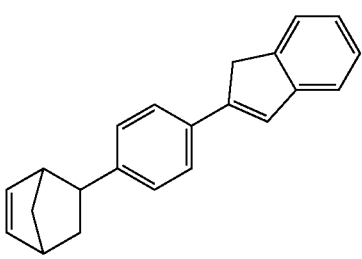

PhIndNB where "Me" means methyl, "Et" means ethyl, "OMe-p" means para-methoxy, "Ph" and "$C_6H_5$" mean phenyl, "$C_6H_4$" means phenylene, and for each of the above subformulae having a methylene bridging group (a $CH_2$ covalently bonded to both the norbornene ring and a functional group), it will be understood that the methylene bridging group can be replaced by a covalent bond or a group —$(CH_2)_b$—, and b is an integer from 1 to 6.

Further preferably the norbornene-type polymer comprises one or more repeating units of Formula I where one of $R^{1-4}$, for example $R^1$, is a photoreactive or crosslinkable group as described above and the others of $R^{1-4}$ are H, and wherein $R^1$ is a group as shown in one of the above subformulae 13-34 and more preferably as shown in subformulae 18, 19, 20, 21 and 22 (DMMIMeNB, DMMIEtNB, DMMIPrNB, DMMIBuNB and DMMIHxNB).

Further preferably the norbornene-type polymer comprises a first type of repeating unit selected from fluorinated repeating units as described above, and a second type of repeating unit selected from crosslinkable repeating units as described above, wherein the first type of repeating unit is selected from subformulae 1-12, more preferably 1, 2, 3, 4, 5, 6 and 12 (NBC$_4$F$_9$, NBCH$_2$C$_6$F$_5$, NBC$_6$F$_5$, NBCH$_2$C$_6$H$_3$F$_2$, NBCH$_2$C$_6$H$_4$CF$_3$, NBalkylC$_6$F$_5$, and PPVENB) and the second type of repeating unit is selected from subformulae 18, 19, 20, 21 and 2 (DMMIMeNB, DMMIEtNB, DMMIPrNB, DMMIBuNB and DMMIHxNB).

In the norbornene-type polymers having a first and a second distinct type of repeat units in accordance with Formula I, the ratio of such first and second type of repeat units is from 95:5 to 5:95. In another preferred embodiment the ratio of such first and second type of repeat units is from 80:20 to 20:80. In still another preferred embodiment the ratio of such first and second type of repeat units is from 60:40 to 40:60. In yet another preferred embodiment the ratio of such first and second type of repeat units is from 55:45 to 45:55.

While Formula I and Ia, as well as each of the subformulae and generic formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that preferred embodiments of the present invention are made to take advantage of such differences by using monomers that are either a mixture of isomers that is rich in either the exo- or endo-isomer, or are essentially the pure advantageous isomer.

Examples of suitable and preferred norbornene-type monomers, norbornene-type polymers and methods for their synthesis are provided herein and can also be found in U.S. Pat. No. 5,468,819, U.S. Pat. No. 6,538,087, US 2006/0020068 A1, US 2007/0066775 A1, US 2008/0194740 A1, PCT/EP2011/004281, U.S. Ser. No. 13/223,784, PCT/EP2011/004282 and U.S. Ser. No. 13/223,884, which are incorporated into this application by reference. Exemplary polymerization processes for norbornenes employ Group VIII transition metal catalysts and are described in the aforementioned US 2006/0020068 A1.

The polycycloolefinic polymers are formed having a weight average molecular weight ($M_w$) that is appropriate to their use. Generally, a $M_w$ from 5,000 to 500,000 is found appropriate for some embodiments, while for other embodiments other $M_w$ ranges can be advantageous. For example, in a preferred embodiment, the polymer has a $M_w$ of at least 30,000, while in another preferred embodiment the polymer has a $M_w$ of at least 60,000. In another preferred embodiment, the upper limit of the polymer's $M_w$ is up to 400,000, while in another preferred embodiment the upper limit of the polymer's $M_w$ is up to 250,000. It will be understood that since an appropriate $M_w$ is a function of the desired physical properties in the cured polymer, films, layers or structures derived therefrom, it is a design choice and thus any $M_w$ within the ranges provided above is within the scope of the present invention.

For crosslinking, the polymer, generally after deposition thereof, is exposed to electron beam or electromagnetic (actinic) radiation such as X-ray, UV or visible radiation, or heated if it contains thermally crosslinkable groups. For example, actinic radiation may be employed to image the polymer using a wavelength of from 11 nm to 700 nm, such as from 200 to 700 nm. A dose of actinic radiation for exposure is generally from 25 to 15000 mJ/cm$^2$. Suitable radiation sources include mercury, mercury/xenon, mercury/halogen and xenon lamps, argon or xenon laser sources, x-ray. Such exposure to actinic radiation is to cause crosslinking in exposed regions. Although other repeating unit pendant groups that crosslink can be provided, generally such crosslinking is provided by repeating units that encompass a maleimide pendant group, that is to say one of $R^1$ to $R^4$ is a substituted or unsubstituted maleimide moiety. If it is desired to use a light source having a wavelength outside of the photo-absorption band of the maleimide group, a radiation sensitive photosensitizer can be added. If the polymer contains thermally crosslinkable groups, optionally an initiator may be added to initiate the crosslinking reaction, for example in case the crosslinking reaction is not initiated thermally.

In another preferred embodiment, the polymer composition comprises a crosslinkable polymer and a stabilizer material or moiety to prevent spontaneous crosslinking and improve shelf life of the polymer. Suitable stabilizers are antioxidants such as catechol or phenol derivatives that optionally contain one or more bulky alkyl groups, for example t-butyl groups, in ortho-position to the phenolic OH group.

Another preferred embodiment according to the present invention relates to an OE device comprising a dielectric structure that was subjected to a process of surface treatment as described above and below. Such OE devices include, among others, OFETs and OFTFs which can be top gate or bottom gate transistors, OLEDs, OPV devices and OPD devices.

Turning now to FIG. 1, a schematic and simplified representation of a top gate OFET device in accordance with a preferred embodiment of the present invention is provided. Such FET device includes a substrate (10), source and drain electrodes (11, 12), a semiconducting layer comprising an organic semiconductor (OSC) material (13), a gate dielectric layer (14), and a gate electrode (15). The gate dielectric layer (14) preferably comprises a fluorinated polymer.

As indicated in FIG. 1 the gate dielectric layer (14) can be a single layer, for example of a fluorinated polycycloolefinic polymer, or a multilayer, for example a bilayer. In a preferred embodiment the gate dielectric layer (14) includes a first dielectric layer, preferably comprising an organic fluoropolymer (14'), very preferably a low k organic fluoropolymer as described above, and a second dielectric layer, preferably comprising a crosslinkable polymer, very preferably a fluorinated crosslinkable polycycloolefinic polymer (14"), and wherein the polymer in the first dielectric layer (14') is not a polycyloolefinic polymer.

The top gate FET device as illustrated in FIG. 1 can be prepared for example by a process comprising the steps of
a) forming source and drain electrodes (11, 12) on a substrate (10) such that they are spaced apart with a channel region located therebetween,
b) depositing a layer of an OSC material (13) on the source and drain electrodes such that it covers at least the channel region,
c) depositing a layer of a first gate dielectric material (14'), which comprises an organic fluoropolymer, on the OSC layer (13), and optionally curing the gate dielectric material (14'),
d) depositing a layer of a second gate dielectric material (14") comprising a crosslinkable fluorinated polycycloolefinic polymer on the OSC layer (13) or on the gate dielectric layer (14'), and curing the second gate dielectric material (14"),
e) exposing the surface of the second gate dielectric layer (14"), or selected parts thereof, to a solvent blend as defined in one or more of claims 1 to 3,
f) removing the solvents of step e),
g) optionally further curing the second gate dielectric material (14"),
h) forming a gate electrode (15) on the second gate dielectric layer (14").

Figure 2:
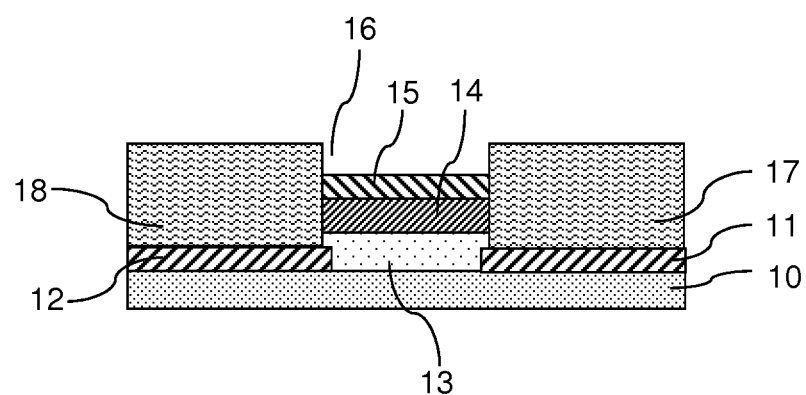
FIG. 2 is a schematic representation of a top gate OFET device in accordance with the present invention.

Turning now to FIG. 2, a schematic and simplified representation of a top gate OFET device in accordance with a preferred embodiment of the present invention is provided. Such FET device includes a substrate (10), source and drain electrodes (11, 12) that are spaced apart to define a channel region (16) therebetween, first and second dielectric structures (17, 18) that are patterned such that they define a well extending over the channel region (16), an OSC layer (13) provided in the channel region (16), a gate dielectric layer (14), and a gate electrode (15).

The bank structures (17, 18) preferably comprise a polycycloolefinic polymer as described above and below.

The top gate OFET device as illustrated in FIG. 2 can be prepared for example by a process comprising the steps of a) forming source and drain electrodes (11, 12) on a substrate (10) such that they are spaced apart with a channel region (16) located therebetween,
b) forming dielectric structures (17, 18) by depositing a dielectric material, which is preferably comprising a fluorinated polycycloolefinic polymer, on the source and drain electrodes (11, 12), thereby defining a well that extends over the channel region (16), and optionally curing the dielectric material of the dielectric structures (17, 18),
c) exposing the surface of the dielectric structures (17, 18), or selected parts thereof, to a solvent blend as described above and below,
d) removing the solvents of step c),
e) optionally further curing the dielectric material of the dielectric structures (17, 18),
f) depositing a layer of OSC material (13) in the well formed by the dielectric structures (17, 18) and onto the source and drain electrodes (11, 12),
g) depositing a layer of gate dielectric material (14) on the OSC layer (13),
h) forming a gate electrode (15) on the gate dielectric layer (14).

Figure 3A:
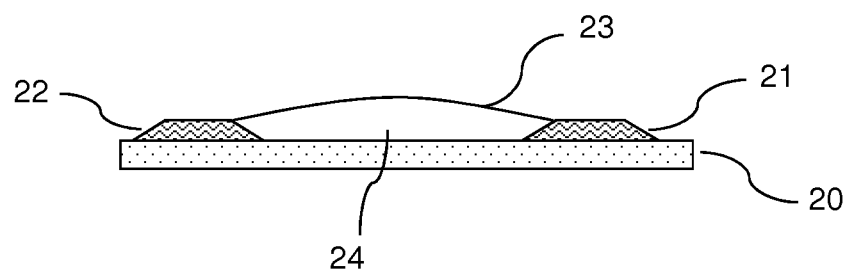
FIGS. 3a and 3b are schematic representations of a process for surface treatment of bank structures in accordance with Example 1.

Another embodiment of the invention relates to a process of treating selected parts of insulating structures or bank structures with a solvent or solvent blend as described above and below. Such a process is schematically and exemplarily illustrated in FIGS. 3a and 3b and is further described below.

The process preferably comprises the steps of
a) forming insulating structures or bank structures (21, 22) by depositing a dielectric material on a substrate (20) and optionally curing the dielectric material, to define a pixel area (24),
b) depositing a solvent blend (23) as defined in one or more of claims 1 to 3 into the pixel area (24), so that the level of the solvent is at the same height as the height of the insulating structures or bank structures (21, 22), and not wetting over the top of the insulating structures or bank structures (21, 22),
c) allowing the solvents to evaporate, and optionally subjecting the insulating structures or bank structures (21, 22) to a further curing step.

Figure 3B:
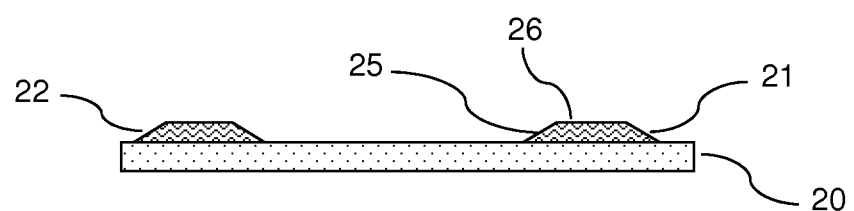
Figure 4:
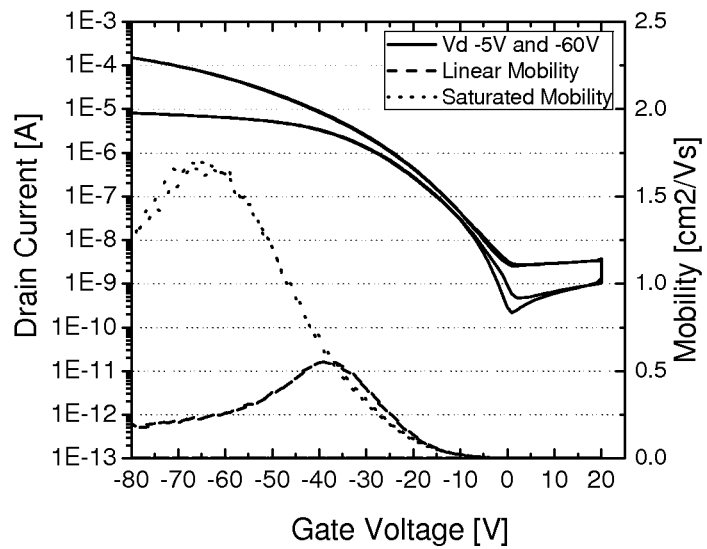
FIGS. 4 to 9 depict the transfer curves of top gate OFET devices in accordance with Example 2.
Figure 5:
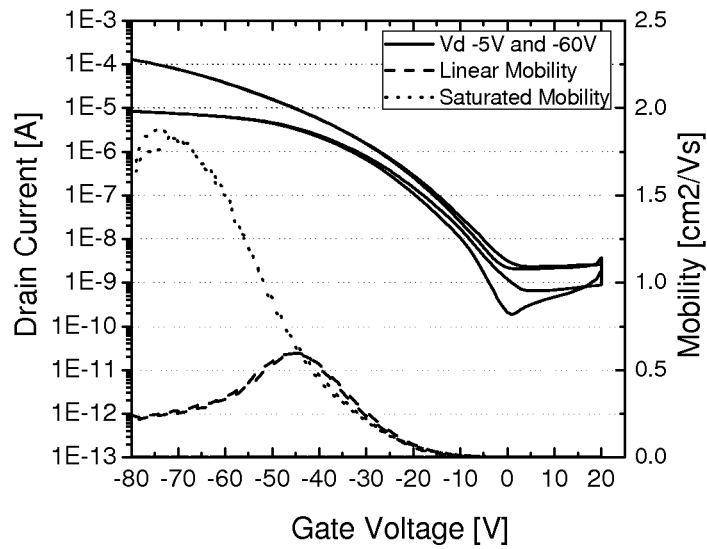
Figure 6:
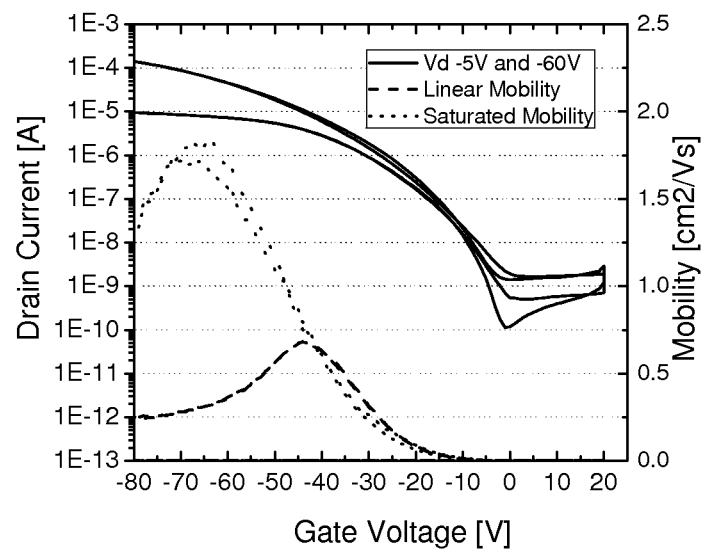
Figure 7:
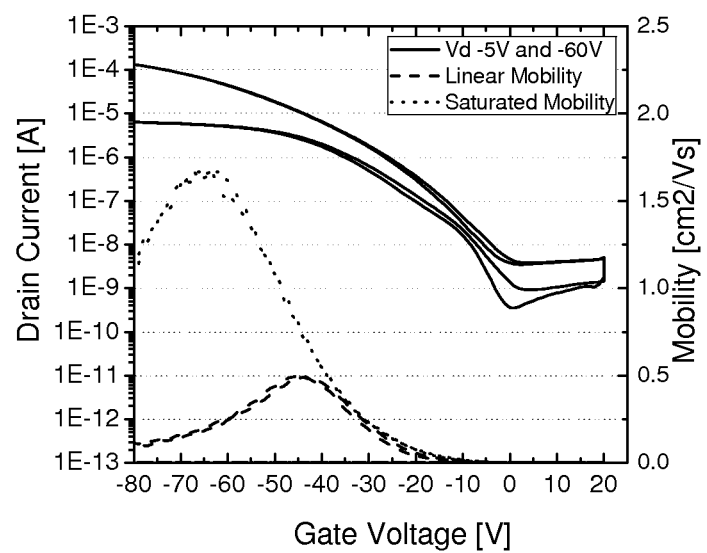
Figure 8:
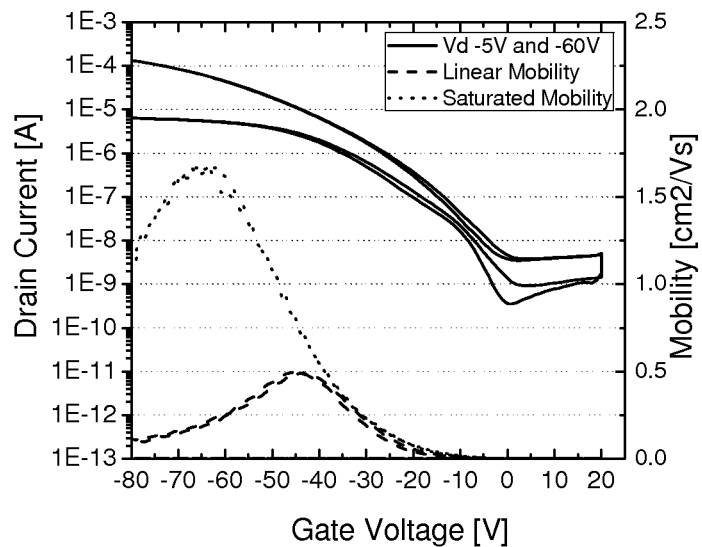
Figure 9:
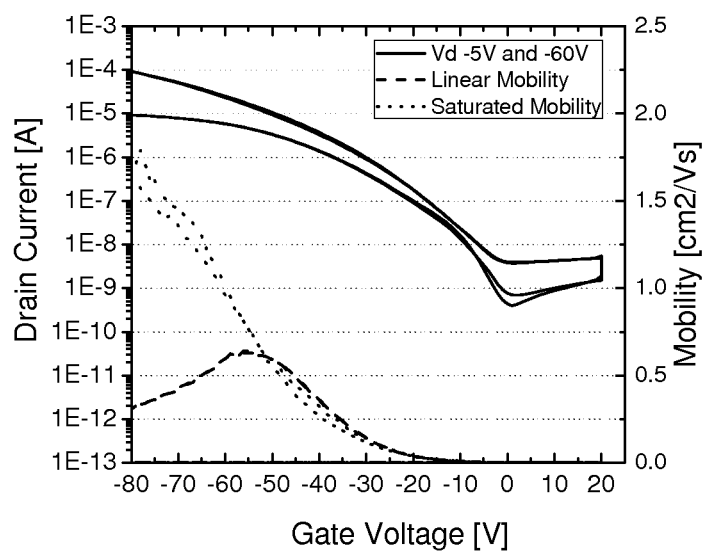

As shown in FIG. 3b, as a result of this process, at the walls of the insulating or bank structures (21, 22) that were in contact with the solvent the surface energy is increased, while at the top of the bank structures (21, 22) the surface energy is unchanged, resulting in high surface energy areas (25) at the pixel walls and low surface energy areas (26) at the top of the bank structures (21, 22).

When in a subsequent device manufacturing step an OSC solution is deposited on the insulating or bank structures (21, 22), this enables a differential in the wetting of the insulating or bank structures with the OSC solution, and results in a reduction in dewetting problems from the pixel walls.

For the surface treatment process in accordance with the present invention, the solvent or solvent blend is deposited on the surface or the parts of the surface of the dielectric structures that should be modified, for example by coating or printing methods.

The solvent is then removed for example by spincoating the substrate dry followed with a temperature to remove excess solvent.

In a preferred embodiment of the present invention, the surface of the dielectric structure is modified with a solvent blend as described above and below as a separate process step.

In another preferred embodiment, the process of the present invention comprises the steps of treating the surface of the dielectric structure with a solvent blend as described above and below, and then further curing or developing the dielectric structure, for example in case the dielectric material of the dielectric structure is photo patterned and developed. After the film is treated with solvent to change surface energy it will no longer be patterned only further cured with UV to become more resistant to swelling.

The solvent blend used in the surface treatment process comprises
- a first solvent selected from the group consisting of aliphatic or aromatic alcohols, and
- a second solvent selected from the group consisting of aliphatic esters and aliphatic ketones.

The first solvent is preferably selected from the group consisting of methanol, cyclohexanol, isopropanol, benzyl alcohol.

The second solvent is preferably selected from the group consisting of methyl acetate, ethyl acetate, methyl n-amyl ketone.

The individual components or functional layers of the OE device, like the substrate, gate, source and drain electrodes, OSC layer, gate dielectric layer, bank structures or other insulating structures, passivation layer and planarization layer, unless stated otherwise above or below, can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

The source, drain and gate electrodes (11, 12, 15) can be applied for example by a sputtering process, and can be patterned by etching and/or lithographic patterning.

The OSC layer (13) and gate dielectric layers (14, 14', 14") can be applied for example by a coating or printing process.

The dielectric structures (17, 18) can be applied for example in the desired shape by solution processing, e.g. in a printing process, drying and optional curing, or they can be applied and patterned into the desired shape by a lithographic process.

In preferred embodiments in accordance with the present invention, deposition and/or forming of the layers and structures in the OE devices, in particular in OFET devices, are performed using solution processing techniques where such techniques are possible. For example a formulation or composition of a material, typically a solution encompassing one or more organic solvents, can be deposited or formed using preferred techniques that include, but are not limited to, dip coating, slot-die coating spin coating, ink jet printing, letter-press printing, screen printing, doctor blade coating, roller printing, reverse-roller printing, offset lithography printing, flexographic printing, gravure printing, reverse gravure printing, web printing, spray coating, brush coating, or pad printing, followed by the evaporation of the solvent employed to form such a solution. For example, an organic semiconductor material, a dielectric structure material and an organic dielectric material can each be deposited or formed by spin coating, flexographic printing, and inkjet printing techniques in an order appropriate to the device being formed.

The solvents are preferably selected from, but not limited to, organic ketones such as methyl ethyl ketone (MEK), methyl n-amyl ketone (2-heptanone, MAK), decanone, 3-decanone, cyclohexanone and, ethers such as butyl-phenyl ether, 4-methylanisole and aromatic hydrocarbons such as cyclohexylbenzene, or mixtures thereof. Preferably, the concentration of the dielectric structure material in the solvent is from 1 to 30 wt. %, although other concentrations can also be appropriate. Organic ketone solvents with a high boiling point have been found to be especially suitable and preferred solvents where inkjet and flexographic printing techniques are employed.

The gate, source and drain electrodes can be deposited or formed by liquid coating, such as spray-, dip-, web- or spin-coating, or by vacuum deposition methods including but not limited to physical vapor deposition (PVD), chemical vapor deposition (CVD) or thermal evaporation methods. Suitable electrode materials and deposition methods are known to the person skilled in the art. Suitable electrode materials include, without limitation, inorganic or organic materials, or composites of the two. Exemplary electrode materials include polyaniline, polypyrrole, poly(3,4-ethylenedioxythiophene) (PEDOT) or doped conjugated polymers, further dispersions or pastes of graphite or particles of metal such as Au, Ag, Cu, Al, Ni or their mixtures as well as sputter coated or evaporated metals such as Cu, Cr, Pt/Pd, Ag, Au or metal oxides such as indium tin oxide (ITO) F-doped ITO or Al-doped ZnO. Organometallic precursors may also be used and deposited from a liquid phase.

Preferably the thickness of a functional layer, for example a gate dielectric or semiconductor layer, the OE devices according to the present invention is from 0.001 (in case of a monolayer) to 10 µm. In other preferred embodiments such thickness ranges from 0.001 to 1 µm, and in still other preferred embodiments from 5 nm to 500 nm, although other thicknesses or ranges of thickness are contemplated and thus are within the scope of the present invention.

Various substrates may be used for the fabrication of the OE device embodiments of the present invention. For example glass or polymeric materials are most often used. Preferred polymeric materials include, but are not limited to, alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced plastic, fluorocarbon polymers, hexafluoropropylene-vinylidenefluoride copolymer, high density polyethylene, parylene, polyamide, polyimide, polyaramid, polydimethylsiloxane, polyethersulphone, poly-ethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, polycycloolefin, silicone rubbers, and silicones, where polyethyleneterephthalate, polyimide, polycycloolefin and polyethylenenaphthalate materials have been found most appropriate. Additionally, for some embodiments of the present invention the substrate can be any suitable material, for example plastic, metal or glass material coated with one or more of the above listed materials. It will be understood that in forming such a substrate, methods such as extruding, stretching, rubbing or photochemical techniques can be employed to provide a homogeneous surface for device fabrication as well as to provide pre-alignment of an organic semiconductor material in order to enhance carrier mobility therein.

The OSC layer can comprise an n- or p-type OSC, which can be deposited by PVD, CVD or solution deposition methods. Effective OSCs exhibit a FET mobility of greater than $1 \times 10^{-5}$ cm$^2$V$^{-1}$s$^{-1}$.

The OSC can comprise a small molecule, an oligomer, a polymer or a co-polymer, or a mixture or blend comprising two or more of the aforementioned.

The OSC can be any conjugated molecule, for example an aromatic molecule containing preferably two or more, very preferably at least three aromatic rings. In some preferred embodiments of the present invention, the OSC contains aromatic rings selected from 5-, 6- or 7-membered aromatic rings, while in other preferred embodiments the OSC contains aromatic rings selected from 5- or 6-membered aromatic rings.

Each of the aromatic rings of the OSC optionally contains one or more hetero atoms selected from Se, Te, P, Si, B, As, N, O or S, generally from N, O or S. Further, the aromatic rings may be optionally substituted with fluoro, cyano, alkyl, alkoxy, polyalkoxy, thioalkyl, silyl, ethynylsilyl, optionally substituted secondary or tertiary alkylamine or arylamine, aryl or substituted aryl groups, wherein ethynylsilyl groups are represented by —C≡C—SiR'R"R"', and substituted secondary or tertiary alkylamine or arylamine are represented by —N(R')(R"), wherein R' and R" are each independently H, optionally fluorinated $C_{1-12}$ alkyl or optionally fluorinated $C_{6-10}$ aryl.

The aforementioned aromatic rings can be fused rings or linked with a conjugated linking group such as —C(T')=C(T")—, —C≡C—, —N(R"")—, —N=N—, (R"")=N—, —N=C(R"")—, where T' and T" each independently represent H, Cl, F, —C≡N or lower alkyl groups such as $C_{1-4}$ alkyl groups and R"" is as defined above.

In a preferred embodiment of the present invention, the OSC includes small molecules and derivatives thereof selected from the group consisting of condensed aromatic hydrocarbons such as, tetracene, chrysene, pentacene, pyrene, perylene, coronene, or soluble substituted and/or heterocyclic derivatives of the aforementioned; oligomeric para substituted phenylenes such as p-quaterphenyl (p-4P), p-quinquephenyl (p-5P), p-sexiphenyl (p-6P) or soluble substituted derivatives of these; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

In another preferred embodiment of the present invention, the OSC is selected from the group consisting of substituted oligoacenes such as pentacene, tetracene or anthracene, or heterocyclic derivatives thereof. Preferred OSCs of this type are bis(trialkylsilylethynyl) oligoacenes, bis(trialkylsilylethynyl) heteroacenes, or fluorinated bis(trialkylsilylethynyl) anthradithiophenes, as disclosed for example in U.S. Pat. No. 6,690,029, WO 2005/055248 A1 or U.S. Pat. No. 7,385,221.

In another preferred embodiment the present invention the OSC comprises an organic conjugated polymer, which can be a homopolymer or copolymer, and in case of copolymers can be an alternating copolymer (e.g. of the ABAB or ABCABC type), statistical (random) copolymer or a block copolymer.

Preferred OSC polymers are selected from conjugated hydrocarbon or heterocyclic polymers including but not limited to the group consisting of polyacene, polyphenylene, poly(phenylene vinylene), polyfluorene, polyindenofluorene, poly(3-substituted thiophene), poly(3,4-bisubstituted thiophene), polyselenophene, poly(3-substituted selenophene), poly(3,4-bisubstituted selenophene), poly(bisthiophene), poly(terthiophene), poly(bisselenophene), poly(terselenophene), polythieno[2,3-b]thiophene, polythieno[3,2-b]thiophene, polybenzothiophene, polybenzo[1,2-b:4,5-b']dithiophene, polyisothianaphthene, poly(N-substituted pyrrole), poly(3-substituted pyrrole), poly(3,4-bisubstituted pyrrole), polyfuran, polypyridine, poly-1,3,4-oxadiazoles, polyisothianaphthene, poly(N-substituted aniline), poly(2-substituted aniline), poly(3-substituted aniline), poly(2,3-bisubstituted aniline), polyazulene, polypyrene, polypyrazoline, polybenzofuran, polyindole, polypyridazine, polytriarylamine, including any co-polymers of the aforementioned, wherein all these polymers are optionally substituted by one or more groups R, wherein R is halogen, CN or a carbyl or hydrocarbyl group, preferably F, CN, alkyl, alkoxy, thiaalkyl, carbonylalkyl, oxacarbonylalkyl, carbonyloxaalkyl, each of which is straight-chain or branched, is optionally fluorinated and preferably has from 1 to 30 C-atoms, or phenyl that is substituted with one or more F atoms and/or with one or more optionally fluorinated alkyl or alkoxy groups having 1 to 20 C atoms.

Further preferred OSCs are copolymers comprising one or more distinct electron acceptor units and one or more distinct electron donor units. Preferred co-polymers of this type comprise one or more units selected from Group A and Group B as defined below, and preferably comprise one or more units of Group A and one or more units of Group B, wherein Group A consists of arylene and heteroarylene groups, preferably having electron donor properties, selected from the group consisting of the following formulae thiophene-2,5-diyl, selenophene-2,5-diyl, thiazole-2,5-diyl, furan-2,5-diyl, 1,4-phenylene, pyridine-2,5-diyl, pyrimidine-2,5-diyl, naphthalene-2,6-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2'-dithiophene-5,5'-diyl, 2,2'-diselenophene-5,5'-diyl, dithieno[3,2-b:2',3'-d]silole-5,5-diyl, dithieno[3,2-b:2',3'-d]pyrrole-5,5-diyl, 4H-cyclopenta[2,1-b:3,4-b']dithiophene-2,6-diyl, carbazole-2,7-diyl, fluorene-2,7-diyl, indaceno[1,2-b:5,6-b']dithiophene-2,7-diyl, benzo[1",2":4,5;4",5":4',5']bis(silolo[3,2-b:3',2'-b']thiophene)-2,7-diyl, phenanthro[1,10,9,8-c,d,e,f,g]carbazole-2,7-diyl, benzo[1,2-d';4,3-d']bisthiazole-2,7-diyl, that is optionally 4,5-disubstituted, 4H-3,5,8,9-tetrathia-cyclopenta[1,2-a;4,3-a']dipentalene-2,6-diyl and 4H-3,5,8,9-tetrathia-4-sila-cyclopenta[1,2-a;4,3-a']dipentalene-2,6-diyl that are 4,4-disubstituted or and optionally 1,7-disubstituted, wherein all these units are optionally substituted by one or more groups R as defined above.

Group B consists of arylene and heteroarylene groups, preferably having electron acceptor properties, selected from the group consisting of the following formulae benzo[2,1,3]thiadiazole-4,7-diyl, benzo[2,1,3]selenadiazole-4,7-diyl, benzo[1,2,5]thiadiazole-4,7,diyl, benzo[1,2,5]selenadiazole-4,7,diyl, benzo[2,1,3]oxadiazole-4,7-diyl, 2H-benzotriazole-4,7-diyl, thieno[3,4-b]pyrazine-2,5-diyl, quinoxaline-5,8-diyl, 3,6-pyrrolo[3,4-c]pyrrole-1,4-dione, thieno[3,4-d]thiazole-4,6-diyl that is optionally 2-substituted, benzo[1,2-b;4,5-b']dithiophene-2,6-dione-3,7-diyl that is optionally 4,8-disubstituted, benzo[1,2-b;4,5-b']difuran-2,6-dione-3,7-diyl that is optionally 4,8-disubstituted, 1,5-dialkyl-1H,5H-pyrrolo[2,3-f]indole-2,6-dione-3,7-diyl that is optionally 4,8-disubstituted, thieno[3,2-b]thiophene-2,5-dione-3,6-diyl that is optionally 1,4-disubstituted, 4,9-di(alkylidene)-s-indaceno[1,2-b;5,6-b']dithiophene-2,7-diyl, wherein all these units are optionally substituted by one or more groups R as defined above.

Where appropriate and needed to adjust the rheological properties as described for example in WO 2005/055248 A1, some embodiments of the present invention employ OSC compositions that include one or more organic binders.

The binder, which is typically a polymer, may comprise either an insulating binder or a semiconducting binder, or mixtures thereof may be referred to herein as the organic binder, the polymeric binder, or simply the binder.

Preferred binders according to the present invention are materials of low permittivity, that is, those having a permittivity $\in$ of 3.3 or less. The organic binder preferably has a permittivity $\in$ of 3.0 or less, more preferably 2.9 or less. Preferably the organic binder has a permittivity $\in$ at of 1.7 or more. It is especially preferred that the permittivity of the binder is in the range from 2.0 to 2.9. Whilst not wishing to be bound by any particular theory it is believed that the use of binders with a permittivity $\in$ of greater than 3.3, may lead to a reduction in the OSC layer mobility in an electronic device, for example an OFET. In addition, high permittivity binders could also result in increased current hysteresis of the device, which is undesirable.

Examples of a suitable organic binders include polystyrene, or polymers or copolymers of styrene and α-methyl styrene, or copolymers including styrene, α-methylstyrene and butadiene may suitably be used. Further examples of suitable binders are disclosed for example in US 2007/0102696 A1.

In one type of preferred embodiment, the organic binder is one in which at least 95%, more preferably at least 98% and especially all of the atoms consist of hydrogen, fluorine and carbon atoms.

The binder is preferably capable of forming a film, more preferably a flexible film.

The binder can also be selected from crosslinkable binders such as acrylates, epoxies, vinylethers, and thiolenes, preferably having a sufficiently low permittivity, very preferably of 3.3 or less. The binder can also be mesogenic or liquid crystalline.

In another preferred embodiment the binder is a semiconducting binder, which contains conjugated bonds, especially conjugated double bonds and/or aromatic rings. Suitable and preferred binders are for example polytriarylamines as disclosed for example in U.S. Pat. No. 6,630,566.

The proportions of binder to OSC is typically 20:1 to 1:20 by weight, preferably 10:1 to 1:10 more preferably 5:1 to 1:5, still more preferably 3:1 to 1:3 further preferably 2:1 to 1:2 and especially 1:1. Dilution of the compound of formula I in the binder has been found to have little or no detrimental effect on the charge mobility, in contrast to what would have been expected from the prior art.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the features of the invention are applicable to all aspects of the invention and may be used in any combination. Likewise, features described in non-essential combinations may be used separately (not in combination).

The invention will now be described in more detail by reference to the following examples, which are illustrative only and do not limit the scope of the invention.

Above and below, unless stated otherwise percentages are percent by weight and temperatures are given in degrees Celsius (° C.). The values of the dielectric constant $\in$ ("permittivity") refer to values taken at 20° C. and 1,000 Hz.

Unless stated otherwise, the values of the surface energy refer to those calculated from contact angle measurement of the polymers according to the method described in D. K. Owens, R. C. Wendt, "Estimation of the surface free energy of polymers", Journal of Applied Polymer Science, Vol. 13, 1741-1747, 1969 or "Surface and Interfacial Tension: Measurement, Theory, and Applications (Surfactant Science Series Volume 119)" by Stanley Hartland (Editor), Taylor & Francis Ltd; 2004 (ISBN: 0-8247-5034-9), chapter 7, p.: 375: "Contact Angle and Surface Tension Measurement" by Kenji Katoh).

Example 1

Increasing the Surface Enemy of a Polynorbornene Dielectric Layer

A copolymer of NBC4F9 and DMMIBuNB ratio 36/64 was spincoated from PGMEA at 10% w/w concentration at 2350 rpm onto a glass substrate. The layer was flood exposed to UV radiation (365 nm) for 20 s. This exposure cures the polynorbornene layer to a total of 220 mJ. The sample was transferred to a spin coater and using a pipette the surface energy modifying solvent blends were deposited onto the centre. Using a stopwatch the sample was exposed to different solvent blends for different lengths of time. After this exposure period the sample was spun dry. The sample was then flood exposed to UV radiation (365 nm) for another 4 minutes. This cured the polynorbornene layer to a total of ~3 J.

For contact angle measurement, the sample was placed onto a contact angle goniometer, (FTA1000 from FirstTen Angstrom) a drop of water was first placed on to the sample and the contact angle was then measured via the software. The same was done for the second solvent diiodomethane. An average of 5 measurements was taken over separate droplets.

Via software the surface energy of the substrate was calculated using the Owens Wendt Geometric mean calculation.

$$\gamma_{sl} = \sigma_s + \sigma_l - 2(\sqrt{\sigma_s^D \cdot \sigma_l^D} + \sqrt{\sigma_s^P \cdot \sigma_l^P})$$

The results are summarized in Table 1.

TABLE 1

Surface Energy after treatment with various solvent blends for various exposure times

| No. | Solvent Blend | Exp. Time | Surface Energy ($Jm^{-2}$) | Dispersive Contribution ($Jm^{-2}$) | Polar Contribution ($Jm^{-2}$) |
|---|---|---|---|---|---|
| 1A) | 49:51 | 30 s | 44.11 | 43.47 | 0.642 |
| 1B) | cyclohexanol/methyl acetate | 60 s | 44.87 | 40.83 | 4.043 |
| 2A) | 26.6:43.4:30 | 30 s | 39.59 | 37.98 | 1.617 |
| 2B) | benzyl alcohol/MAK/IPA | 60 s | 41.45 | 39.72 | 1.732 |
| 3A) | 52:48 | 30 s | 45.53 | 41.18 | 4.352 |
| 3B) | cyclohexanol/ethyl acetate | 60 s | 44.12 | 40.30 | 3.814 |
| 4) | No Treatment (Control) | — | 26.61 | 25.32 | 1.290 |

It can be seen that the surface energy is significantly increased for samples 1-3 (with solvent treatment) compared to sample 4 (untreated), which still has a high surface energy.

Example 2

Increasing the Surface Energy of Bank Structures

Bank structures were prepared on glass substrates as described below.

A glass substrate was pre-cleaned by sonicating in Decon 90 for 10 minutes at +60° C., then sonicating in deionised water for 5 minutes at +60° C., and finally sonicating in methanol for 5 minutes at +60° C.

The substrate was dried using a spinner and transferred to a spin coater. A layer of a copolymer of NBC4F9 and DMMIBuNB ratio 36/64 was applied onto it and the substrate was spun at 1500 rpm for 30 seconds to give a uniform film. The coated substrate was placed on a hot plate at 100° C. for 30 seconds to ensure that any remaining solvent in the coating is removed, and then exposed to UV light (365 nm) for 5 seconds (using a mask aligner) in order to pattern the photoresist.

The patterned substrate was subjected to a post baking step on a hot plate at 100° C. for 60 seconds, and developed for 3 minutes using a 36:64 (V/V %) blend of methanol:o-xylene. The sample holder was shaken for 3 minutes to ensure complete development. After this development stage the substrate is spun dry.

The surface energy of the bank structures was significantly increased after exposure to the solvents.

Example 2

TOP Gate OFET with Gate Dielectric Subjected to Surface Treatment

Top gate OFET devices were prepared as described below, comprising a glass substrate, Ag source and drain electrodes, a gate dielectric layer of Lisicon D142® dielectric (Merck KGaA, Darmstadt, Germany), and an insulating adhesive layer of a norbornene copolymer of $NBC_4F_9$ and DMMIBuNB, ratio of co-monomers 36/64, on top of the dielectric layer:

A substrate of Corning Eagle XG glass was cleaned and dried by spin off on the spin coater.

Source and drain electrodes of 40 nm thickness were thermally evaporated through a shadow mask onto the substrate, creating a channel L=50 μm and W=1000 μm.

Then the substrate was treated with the surface treatment formulation Lisicon™ M001 (available from Merck KGaA, Darmstadt, Germany) for 1 min and dried by spin off on the spin coater. The sample was further annealed for 1 min on a hotplate at 100° C.

Next the OSC formulation Lisicon® S1200 (available from Merck KGaA, Darmstadt, Germany) was spun onto the substrate after above treatment and then annealed for 1 min at 100° C. on a hotplate.

Then Lisicon® D142 dielectric (available from Merck KGaA, Darmstadt, Germany) was spun and annealed at 100° C. at the hotplate for 2 minutes.

The dielectric material (copolymer of NBC4F9 and DMMIBuNB ratio 36/64) was spincoated from PGMEA at 10% w/w concentration at 2350 rpm onto the Lisicon® D142 dielectric layer.

These devices were flood exposed to UV radiation (365 nm) for 20 s. This exposure cured the polynorbornene layer to a total of 220 mJ. The devices were transferred to a spin coater and using a pipette the surface energy modifying blends were deposited onto the centre of the devices. Using a stopwatch the devices were exposed to the different blends for different lengths of time. After this exposure period the devices were spun dry. The devices were then flood exposed to UV radiation (365 nm) for another 4 minutes and 22 seconds. This cured the polynorbornene layer to a total of ~3 J.

After modification of the surface the finalized top gate device was fabricated by evaporating an gate electrode to the structure The surface energy of the poynorbornene layer before and after solvent exposure was determined by contact angle measurements. The contact angle was determined separately in water and diiodomethane. Based on the contact angle values the surface energy was calculated.

The transfer characteristics for the top gate OFET devices 1A, 1B, 2A, 3A, 3B and 4 is shown in FIGS. 4 to 9, respectively. The linear and saturated mobility are shown in Table 2.

TABLE 2

Linear and Saturated mobility of OFET devices comprising a Lisicon D142/polynorbornene gate dielectric bilayer with and without treatment with various solvent blends for various exposure times

| No. | Solvent Blend | Exp. Time | Linear Mobility $cm^2/Vs$ | Saturated Mobility $cm^2/Vs$ |
|---|---|---|---|---|
| 1A) | 49:51 | 30 s | 0.55 | 1.77 |
| 1B) | cyclohexanol/methyl acetate | 60 s | 0.60 | 1.90 |
| 2A) | 26.6:43.4:30 | 30 s | 0.68 | 1.80 |
| 2B) | benzyl alcohol/MAK/IPA | 60 s | — | — |
| 3A) | 52:48 | 30 s | 0.50 | 1.70 |
| 3B) | cyclohexanol/ethyl acetate | 60 s | 0.55 | 1.50 |
| 4) | No Treatment (Control) | — | 0.64 | 1.80 |

From FIGS. 4 to 9 and Table 2 it can be seen that, after solvent treatment of the surface of the polynorbornene layer to increase its surface energy, the OFET performance remains substantially unchanged.

The invention claimed is:

1. A process of surface treatment of a dielectric structure in an organic electronic (OE) device, comprising the step of exposing the surface of the dielectric structure, or specific parts of said surface, to a solvent blend comprising
    a first solvent selected from the group consisting of aliphatic or aromatic alcohols, and
    a second solvent selected from the group consisting of aliphatic esters and aliphatic ketones.
2. The process according to claim 1, wherein the first solvent is selected from the group consisting of methanol, cyclohexanol, isopropanol, benzyl alcohol.
3. The process according to claim 1, wherein the second solvent is selected from the group consisting of methyl acetate, ethyl acetate, methyl n-amyl ketone.
4. The process according to claim 1, wherein the dielectric structure comprises a crosslinked organic polymer.
5. The process according to claim 1, wherein the dielectric structure comprises a crosslinked and fluorinated organic polymer comprising one or more crosslinkable groups.
6. The process according to claim 1, wherein the dielectric structure comprises a polycycloolefinic polymer.
7. The process according to claim 6, wherein the polycycloolefinic polymer is a norbornene-type polymer.
8. The process according to claim 6, wherein the polycycloolefinic polymer comprises two or more distinct types of repeating units.
9. The process according to claim 6, wherein the polycycloolefinic polymer comprises a first type of repeating unit having a pendant fluorinated group.
10. The process according to claim 9, wherein the polycycloolefinic polymer comprises a first type of repeating unit having a pendant alkyl, aryl or aralkyl group that is fluorinated or perfluorinated.
11. The process according to claim 6, wherein the polycycloolefinic polymer comprises a second type of repeating unit having a pendant crosslinkable group.
12. The process according to claim 11, wherein the polycycloolefinic polymer comprises a second type of repeating unit having a substituted or unsubstituted maleimide portion, an epoxide portion, a vinyl portion, an acetylene portion, an indenyl portion, a cinnamate portion or a coumarin portion.
13. The process according to claim 6, wherein the polycycloolefinic polymer comprises one or more distinct types of repeating units of Formula I

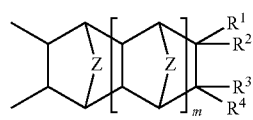

wherein Z is selected from —$CH_2$—, —$CH_2$—$CH_2$— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group, wherein at least one of $R^1$, $R^2$, $R^3$ and $R^4$ comprises a fluorinated group.
14. The process according to claim 13, wherein the polycycloolefinic polymer comprises one or more repeating units of Formula I that are formed by one or more norbornene-type monomers selected from the group consisting of the following formulae:

NBC$_4$F$_9$

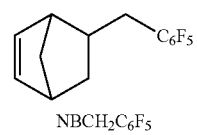

NBCH$_2$C$_6$F$_5$

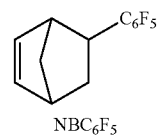

NBC$_6$F$_5$

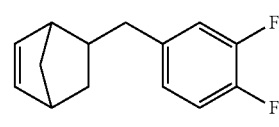

NBCH$_2$C$_6$H$_3$F$_2$

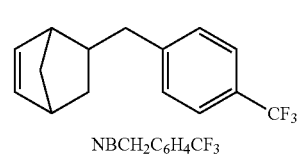

NBCH$_2$C$_6$H$_4$CF$_3$

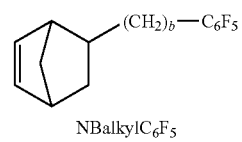

NBalkylC$_6$F$_5$

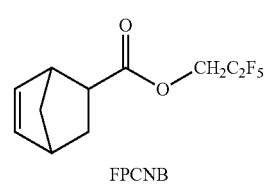

FPCNB

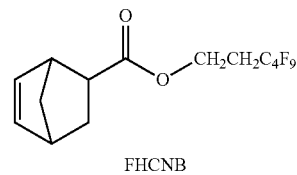

FHCNB

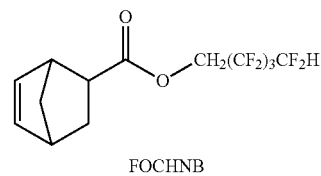

FOCHNB

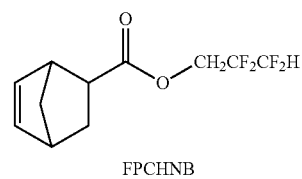

FPCHNB

-continued

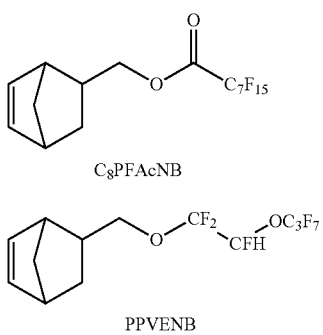

C8PFAcNB

PPVENB

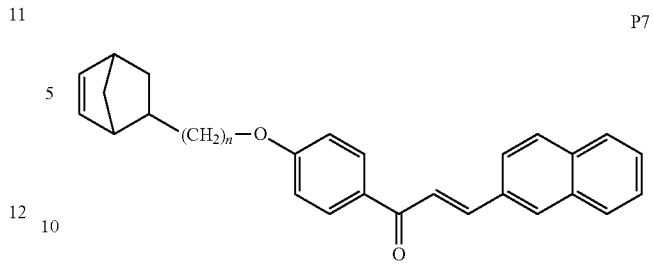

where n is an integer from 1 to 8, $Q^1$ and $Q^2$ are each independently from one another —H or —CH$_3$, and R' is —H or —OCH$_3$.

16. The process according to claim 6, wherein the polycycloolefinic polymer comprises one or more repeating units of Formula I that are formed during polymerization from norbornene-type monomers selected from the group consisting of the following formulae:

where "C$_6$F$_5$" means pentafluorophenyl, in sub-formula 11 "PFAc" means —OC(O)—C$_7$F$_{15}$, and for each of the above subformulae having a methylene bridging group (a CH$_2$ covalently bonded to both the norbornene ring and a functional group) it will be understood that the methylene bridging group can be replaced by a covalent bond or a group —(CH$_2$)$_b$— as in formula 6, and b is an integer from 1 to 6.

15. The process according to claim 6, wherein the polycycloolefinic polymer comprises one or more repeating units of Formula I that are formed during polymerization from norbornene-type monomers selected from the group consisting of the following formulae:

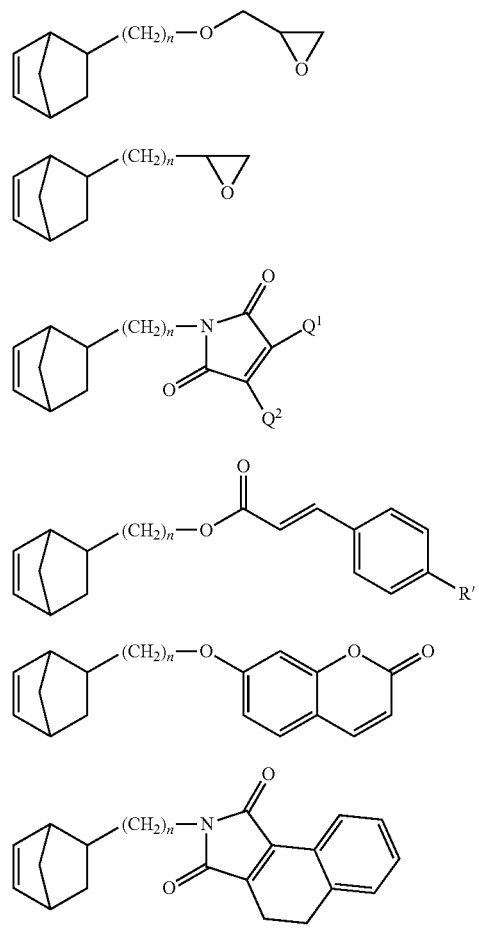

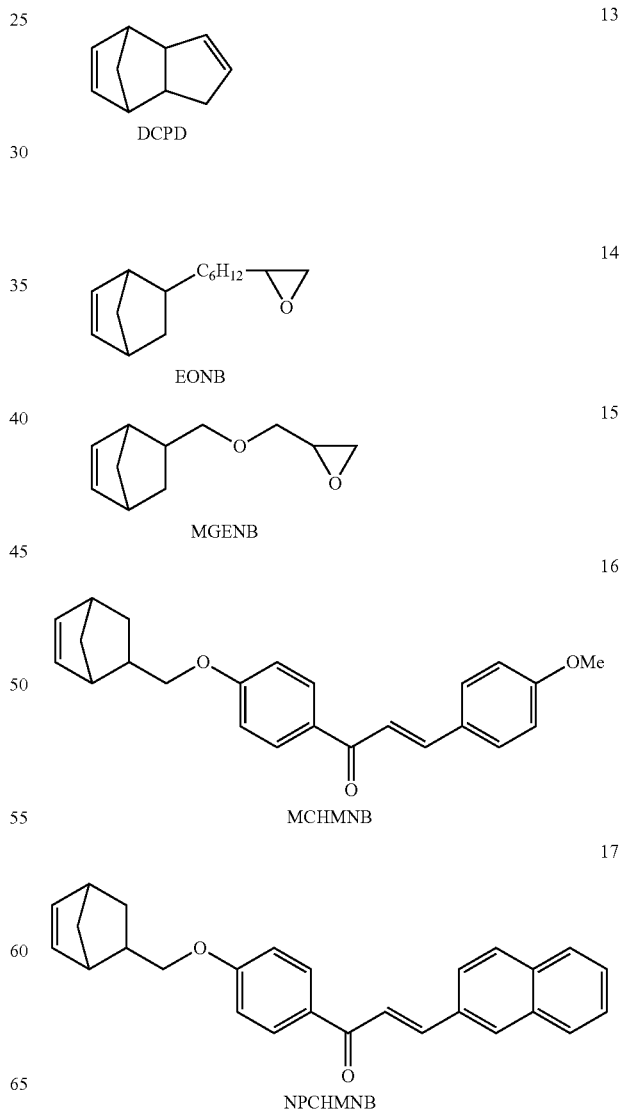

-continued
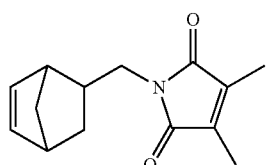
DMMIMeNB
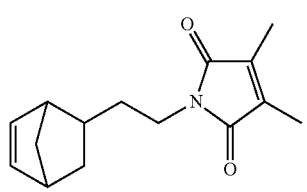
DMMIEtNB
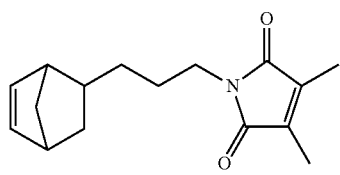
DMMIPrNB
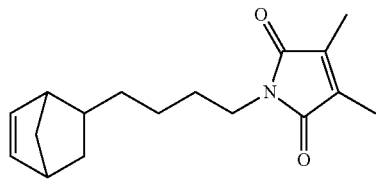
DMMIBuNB
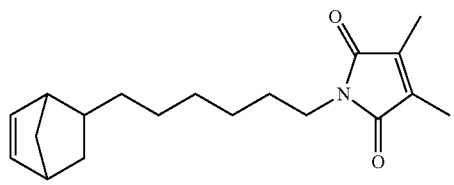
DMMIHxNB
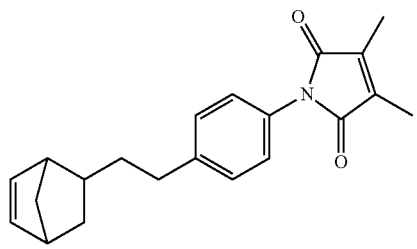
EtPhDMMINB
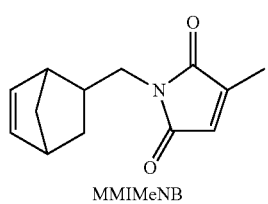
MMIMeNB
-continued
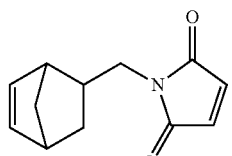
MINB
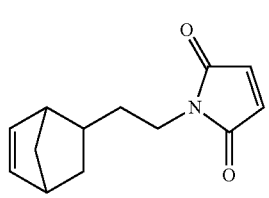
MIENB
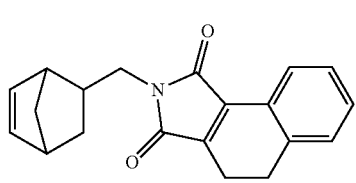
DHNMINB
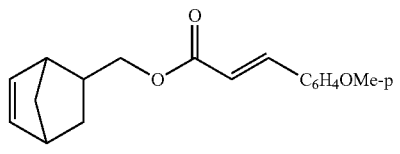
MeOCinnNB
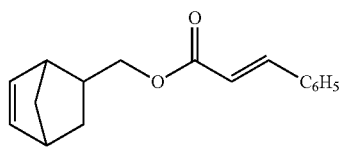
CinnNB
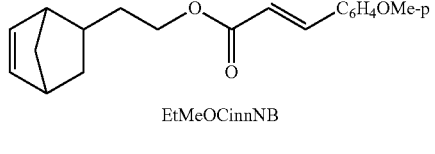
EtMeOCinnNB
MeCoumNB
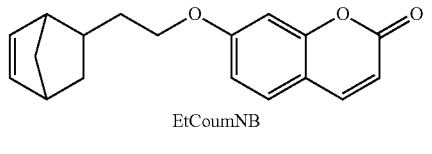
EtCoumNB -continued

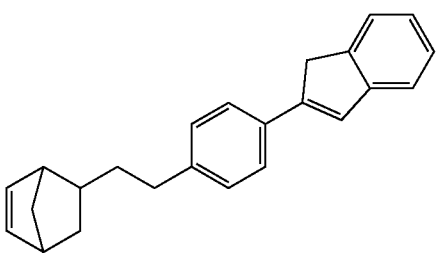

EtPhIndNB

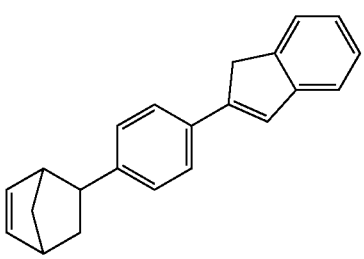

PhIndNB where "Me" means methyl, "Et" means ethyl, "OMe-p" means para-methoxy, "Ph" and "$C_6H_5$" mean phenyl, "$C_6H_4$" means phenylene, and for each of the above subformulae having a methylene bridging group (a $CH_2$ covalently bonded to both the norbornene ring and a functional group), it will be understood that the methylene bridging group can be replaced by a covalent bond or a group —$(CH_2)_b$—, and b is an integer from 1 to 6.

17. The process according to claim 1, wherein the dielectric structure is a gate dielectric layer, passivation layer, planarization layer, insulating structure or bank structure, or a part of one of the aforementioned layers or structures.

18. The process according to claim 1, wherein the OE device further comprises a gate electrode and an organic semiconductor (OSC) layer, and the dielectric structure is a gate dielectric layer that comprises a first dielectric layer that contacts the OSC layer and a second dielectric layer that contacts the gate electrode, wherein both the first and the second dielectric layer comprise a fluorinated polymer.

19. The process according to claim 18, wherein the first layer comprises an organic fluoropolymer having a permittivity $\in$ of 3.0 or less, which is not a polycycloolefinic polymer, and the second dielectric layer comprises a crosslinked fluorinated polycycloolefinic polymer.

20. The process according to claim 19, wherein the organic fluoropolymer of the first layer is a perfluoropolymer having a permittivity $\in$ of 3.0 or less.

21. A process for treating selected parts of insulating structures or bank structures with a solvent blend, comprising the steps of
a) forming insulating structures or bank structures (21, 22) by depositing a dielectric material on a substrate (20) and optionally curing the dielectric material, to define a pixel area (24),
b) depositing a solvent blend (23) as defined in claim 1, into the pixel area (24), so that the level of the solvent is at the same height as the height of the insulating structures or bank structures (21, 22), and not wetting over the top of the insulating structures or bank structures (21, 22),
c) allowing the solvents to evaporate, and optionally subjecting the insulating structures or bank structures (21, 22) to a further curing step.

* * * * *